Figure 1:
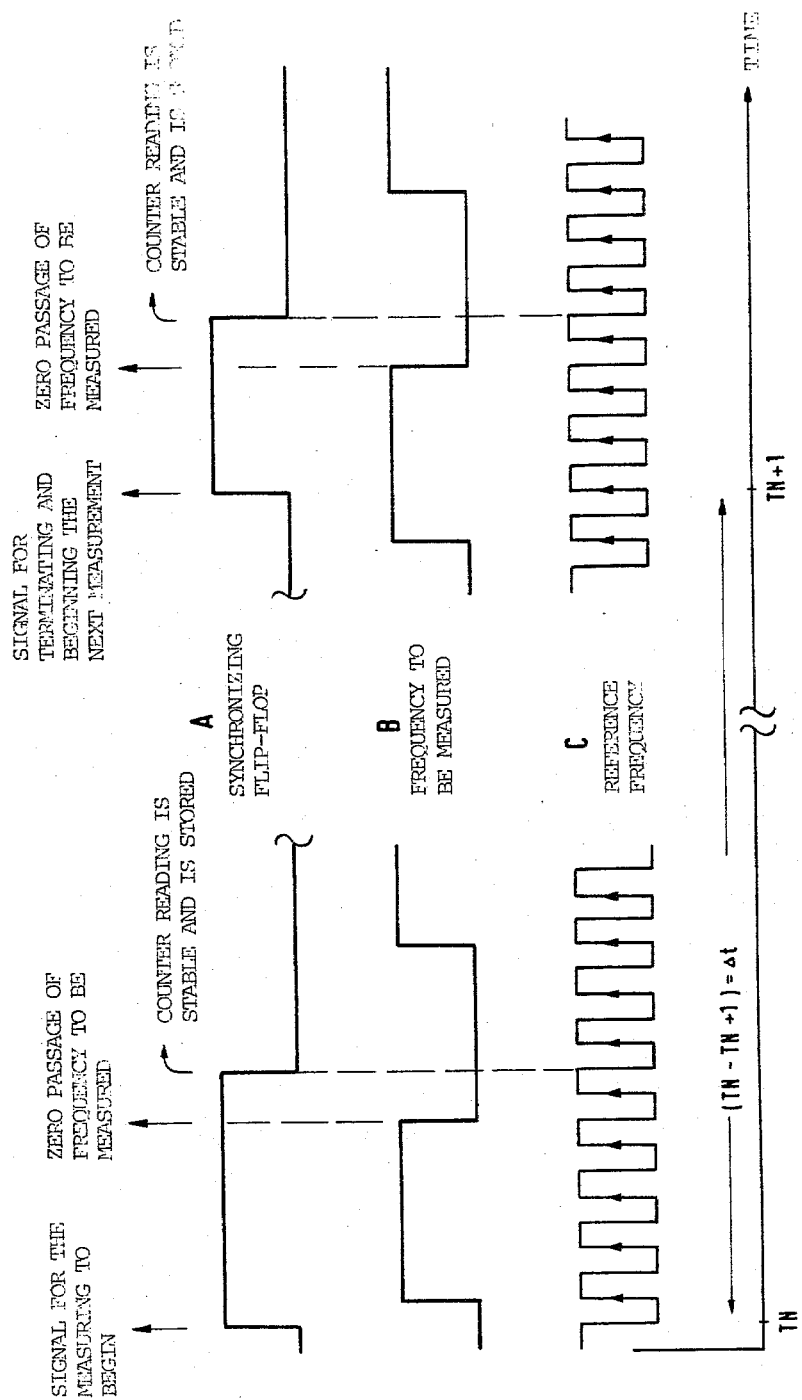

United States Patent [19]

Waldmann et al.

[11] 4,350,950

[45] Sep. 21, 1982

[54] FREQUENCY MEASURING METHOD AND APPARATUS

[75] Inventors: Dieter Waldmann, Karben; Bernd Ohnesorge, Maintal, both of Fed. Rep. of Germany

[73] Assignee: Nord-Micro Elektronik Feinmechanik AG, Frankfurt, Fed. Rep. of Germany

[21] Appl. No.: 153,569

[22] Filed: May 27, 1980

[30] Foreign Application Priority Data

May 30, 1979 [DE] Fed. Rep. of Germany ....... 2921899

[51] Int. Cl.$^3$ ............................................. G01R 23/02
[52] U.S. Cl. ................................................. 324/78 D
[58] Field of Search ................ 324/78 R, 78 D, 79 R, 324/79 D

[56] References Cited

U.S. PATENT DOCUMENTS

| | | | |
|---|---|---|---|
| 4,050,747 | 9/1977 | Ruhnau et al. | 324/78 D |
| 4,187,403 | 2/1980 | Ast | 324/78 D |
| 4,215,308 | 7/1980 | Kusters | 324/78 D |

*Primary Examiner*—Michael J. Tokar
*Attorney, Agent, or Firm*—W. G. Fasse; D. F. Gould

[57] ABSTRACT

The frequency of a pulse signal is measured with the aid of a reference signal generated in an oscillator (11). Both the pulses of the frequency to be measured and the pulses of the reference frequency are counted by separate counters (12, 13) and the counts or counted results are stored in separate memories (14, 15). A flip-flop (21) is set and reset to determine each measuring duration. The difference between two successive counts of the measured frequency counter (14) corresponds to the pulses or rather periods counted during the measuring time duration. The difference between two successive counts of the reference frequency counter (15) corresponds to the length of the measuring time duration whereby the resolution is determined by the reference frequency. A microprocessor (16) divides the number of periods counted by the measuring time duration to ascertain the frequency to be measured which may then be displayed.

8 Claims, 2 Drawing Figures

FREQUENCY MEASURING METHOD AND APPARATUS

BACKGROUND OF THE INVENTION

The invention relates to a method and to a circuit arrangement for measuring a frequency in which a reference frequency is produced which is placed into a fixed relationship with the frequency to be measured, whereby the frequency to be measured and the reference frequency are each supplied to a respective counter.

Known methods of this type cause a frequency measurement in which a statistical mean is produced for several short measuring periods or the measuring period is prolonged in order to achieve a high resolution.

OBJECTS OF THE INVENTION

In view of the above it is the aim of the invention to achieve the following objects singly or in combination:

to obtain a respective information regarding a value or values to be measured while the measuring period is of random duration, whereby these values may be different for successive measuring periods and the values may be measured substantially simultaneously with different measuring time durations;

to display measured frequencies resulting from different measuring time durations, but relating to the same pulse train, the frequency of which is to be measured; and to greatly improve the measuring resolution of frequency measurements and to adapt the degree of resolution to the type of measurement.

SUMMARY OF THE INVENTION

According to the invention there is provided a method for the measuring of the frequency of a pulse train, which is characterized in that a time counter for a reference frequency stores in a respective reference time memory a time representing reference frequency pulse count in response to a control signal representing to the zero passage, the polarity or direction of which is determined, of a pulse of the frequency to be measured at the end of a measuring period whereby, said control signal controls the storing, or reading-in, of the time count result of the reference frequency into said reference time memory, that a period counter for the frequency to be measured is triggered by the zero passages, the polarity or direction of which is determined, of the pulses of the frequency to be measured, that the count result of the period counter for the frequency to be measured is stored in a respective period memory in resonse to said control signal at the end of a measuring period, and that the frequency or period duration for periods of different lengths is computed, in a parallel manner, from several successive and stored count results of the reference frequency counter which correspond to a time measurement, and from several successive and stored count results of the counter for the frequency to be measured.

The invention also provides a circuit arrangement for performing the above method.

BRIEF FIGURE DESCRIPTION

Figure 2:
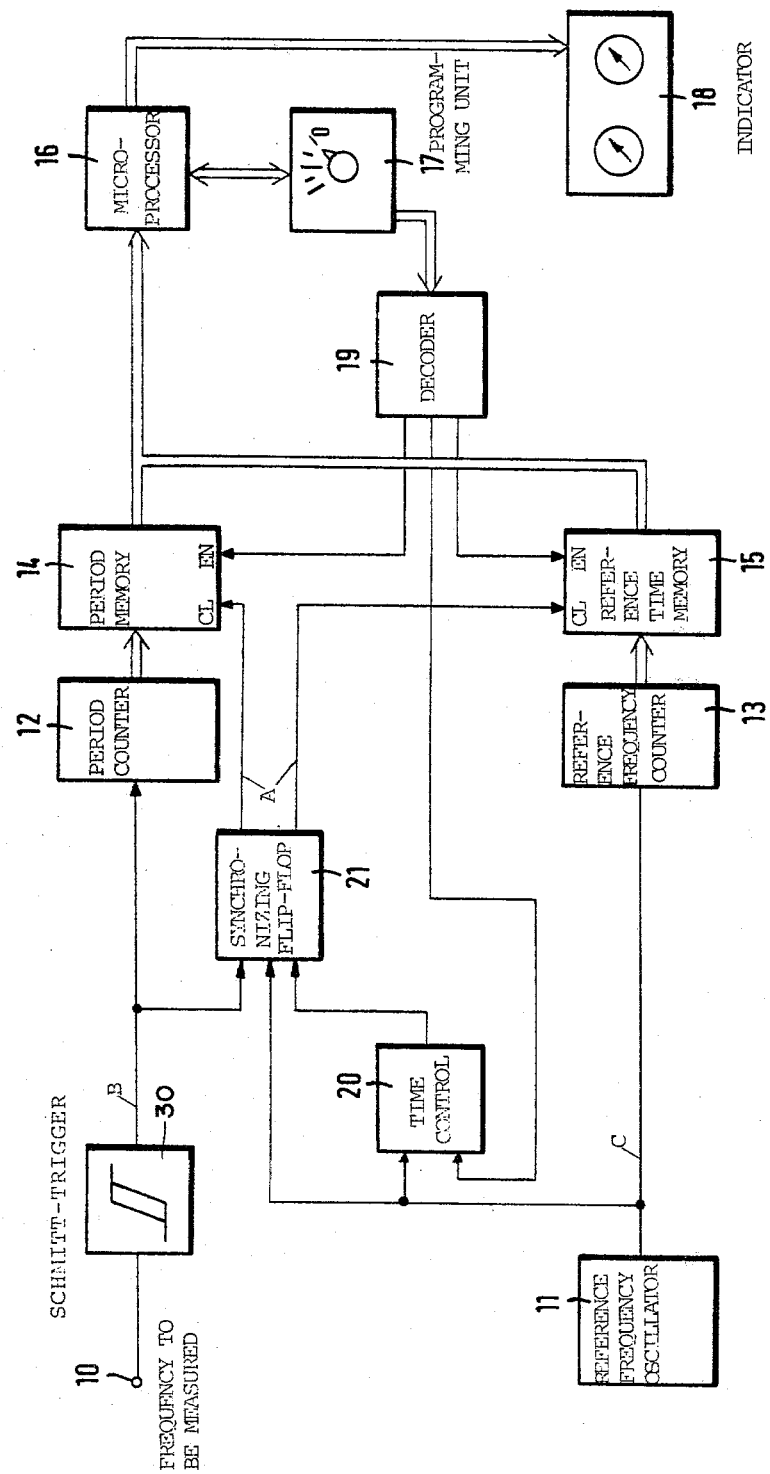

In order that the invention may be clearly understood, it will now be described, by way of example, with reference to the accompanying drawings, wherein:

FIG. 1 shows a time diagram of the pulse trains as they are generated in FIG. 2; and FIG. 2 is a schematic block diagram of a circuit arrangement for performing the method according to the invention;

DETAILED DESCRIPTION OF PREFERRED EXAMPLE EMBODIMENTS AND OF THE BEST MODE OF THE INVENTION

In the following, the frequency to be measured will briefly be referred to as the measuring frequency which is applied to the input 10 of a pulse forming network 30.

A frequency generator 11 produces a reference frequency which may be in the range of about 20 megacycles (MHz).

The measuring frequency (B) is supplied to a period counter 12 and the reference frequency (C) is supplied to a time counter 13. A memory 14 is connected to the output of the period counter 12 and a memory 15 is connected to the output of the reference frequency or time counter 13. The evaluation of the measured results takes place in a microprocessor 16 which is controlled by a programming unit 17. The measured results are displayed in an indicator device 18. A decoder 19 is connected to the output of the programming unit. The decoder serves for addressing the memories 14 and 15 and the programmer controls a time control circuit arrangement 20. Further, there is provided a synchronizing circuit in the form of a flip-flop 21. The counters 12 and 13 do not have reset inputs as can be seen in FIG. 2 and hence, during operation, are continuously running.

In FIG. 1 the impulse characteristic at the output of the synchronizing flip-flop 21 is shown at A. The pulse train (B) designates the pulses of the measuring frequency and the pulse train (C) designates the pulses of the reference frequency of the oscillator 11.

The described circuit arrangement operates as follows.

The measuring frequency is measured in a shortest measuring time duration or time slot $\Delta t$. A signal at the time TN for the beginning of a measuring period sets the synchronizing flip-flop 21. The next negative zero passage of the measuring frequency resets this flip-flop 21. The resetting is delayed until the reference frequency or time counter 13 has stepped through and now causes the storing of the count results of the reference frequency or time counter 13 in the corresponding memory 15 in response to a control signal. The resolution of the measuring frequency is 50 nanoseconds for a reference frequency of 20 MHz.

The measuring frequency is supplied to the period counter 12. The above mentioned resetting of the synchronizing flip-flop 21 also causes the storing of the count result of the period counter 12 in the corresponding memory 14. The difference between two successive count results of the period counter 12 corresponds to the number of periods during one measuring time duration. The difference of the corresponding count results of the reference frequency or time counter 13 corresponds to the time duration of this measuring time with the resolution of the reference frequency. The microprocessor 16 calculates the quotient from the measured time and from the number of periods counted. The quotient corresponds to the precise period duration or to the frequency which is to be measured.

If the processor 16 stores several sequential count results in a further memory and corrects these values if an overflow of a counter has occurred, the processor may use a multiple of the shortest measuring time for calculating, from the corresponding count results, the period duration and the frequency of the signal to be measured, whereby the resolution is even larger. A new, actual value of the measuring time which has been prolonged in this manner may thus be calculated respectively after the termination of a short measuring period. The corresponding adjustment required for this purpose may be made in the programming unit 17.

In this manner it is possible to display in the indicator device 18 the instantaneous values of the frequency measuring as well as simultaneously those values representing a prolonged measuring.

In connection with the above mentioned prolonged measuring time duration it is possible to determine the measuring result anew by way of a flexible beginning of the measuring respectively after the termination of a short measuring time duration.

A special advantage of the described arrangement or of the described measuring method resides in that the measuring is not interrupted by the selection of the measured values, whereby the resolution in connection with a prolonged measuring time duration is improved proportionally to the number of the short measuring time durations. Contrary thereto, the resolution possible in connection with the statistical ascertaining of a mean value over short measuring periods is improved only proportionally to the square root of the number of the short measuring periods.

Another advantage is to be seen in that the duration of a measuring period may be adapted to the respective requirements for the resolution capability and for a rapid measured value output.

Although the invention has been described with reference to specific example embodiments, it is to be appreciated, that it is intended to cover all modifications and equivalents within the scope of the appended claims.

Further details of the operation and structure of the circuit arrangement according to FIG. 2 will now be described. The circuit begins to work practically immediately when the power supply is switched on. The incoming signals at the input 10 are transformed into defined impulses by means of said pulse forming network 30 such as a Schmitt-trigger 30. The synchronizing flip-flop 21 is set by the time control circuit 20 and is only reset when a signal comes first from the Schmitt-trigger 30 and thereafter from the reference frequency generator 11, that is, when a negated or negative flank of the pulse of the respective output signals appears. The flip-flop 21 then supplies a clock impulse signal to the clock input CL of the memories 14 and 15.

The addressing inputs EN of the memories 14 and 15 receive the read instructions from the address decoder 19. The signals on lines A to the clock inputs CL of the memories 14 and 15 for storing the count result from the counters 12 and 13 are generated by the flip-flop 21. In this connection, the timing by the time control circuit 20 is such that at most one overflow can result in each counter between two read cycles during which the count results from the counters 12 and 13 are stored in the memories.

The time control circuit 20 may be a frequency divider with a variable division ratio and may be triggered by the measuring frequency, or as shown in FIG. 2, by the reference frequency from the generator 11. The time control circuit 20 generates a reset signal for the flip-flop 21, when, for example, a previously fixed partial count value has been reached. Thereafter the divider or time control circuit 20 is automatically reset to "0". In an alternative the reset signal for the flip-flop 21 may be part of the program in the programming unit 17. The signal must then appear so frequently that at most one overflow has occurred in each counter after the last reading by that counter. The counter 13 comprises, for example, IC's of the type LS169 electrically interconnected to 20 bits. The counter 12 comprises for example, ICs of the type LS393. The memories 14 and 15 comprise, for example, ICs of the type LS374.

Conventional mini computers, for example, of the type PET, KIM or others, may be used as the microprocessor 16, the function of which has been described above. Such a mini computer also contains the programming unit 17 and a display 18.

The programming unit 17 determines primarily which measuring time is ascertained. In addition to that, it controls the indicator 18. The decoder 19 decodes the address signals supplied by the micro-processor 16 for the read-out of the memories 14 and 15. The decoder 19 may be constructed of ICs of the type LS85 and LS138. The signal for the start of each new measurement or rather evaluation of the count results, whereby measurements follow one after the other without interruption, is supplied, as seen, by the time control circuit 20.

What is claimed is:

1. A circuit arrangement for measuring a frequency, comprising continuously running period counter means (12) having a counting input for receiving a signal having said measuring frequency, and a period counter output for providing counted periods of said measuring frequency, period memory means (14) operatively connected to said period counter output for storing a number of periods counted by said period counter means (12), reference frequency generating means (11), continuously running time counter means (13) operatively connected to said reference frequency generating means (11) for providing time duration measurements, time memory means (15) operatively connected to said time counter means (13) for storing said time duration measurements of said time counter means (13), synchronizing means (21) connected to said period and time memory means for controlling the transfer of counts from said period and time counter means (12, 13) into the respective period and time memory means (14, 15), and control means (17, 19, 20) operatively connected to said synchronizing means (21) and to said period and time memory means for determining the operation of said period and time memory means, and computer means (16) operatively connected to said period and time memory means (14, 15) and to said control means for calculating the quotient of the number of periods counted by said period counter means and the time duration measurements from said time counter means, whereby the difference between two successively stored counts in the period memory means (14) provides the numerator and whereby the difference between two successively stored counts in the time memory means (15) provides the denominator of said quotient.

2. A method for measuring the frequency of a pulse signal, comprising the following steps:
   (a) continuously counting in a period counter (12) pulses of said pulse signal in response to zero passages of preselected polarity or direction of said pulse signal, (b) continuously counting in a time counter (13) reference frequency pulses, (c) producing a control signal for determining a measuring duration in response to a zero passage of a predetermined polarity or direction of said pulse signal, (d) using said control signal for causing the storing of counted zero passages of said pulse signal the frequency of which is to be measured in a period memory, (e) using said control signal for causing the storing of counted reference frequency pulses in a time memory, (f) calculating the difference between two successive count results in said period memory to provide a period count of said pulse signal, (g) calculating the difference between two corresponding successive count results in said time memory to provide a time measurement, and (h) calculating in parallel fashion the quotient of said period count of said pulse signal and of said time measurement for determining said frequency.

3. The method of claim 2, wherein said calculating takes place continuously at predetermined time intervals for displaying the calculated frequency.

4. The method of claim 2, further comprising producing, independently of said first mentioned control signal, read-out control signals for said period memory and for said time memory, and reading-out the contents of said period and time memories in response to said read-out control signals so that said storing steps and said reading-out from said period and time memories may be controlled independently of each other.

5. The method of claim 2, further comprising adjusting the duration of said time measurement in its time length for varying said duration.

6. The method of claim 2, further comprising adjusting two time measurement durations to different time lengths in parallel to each other and displaying the two resulting measurements independently of each other.

7. The method of claim 6, further comprising terminating two time measurements of different durations at the same time.

8. The method of claim 6, further comprising beginning two time measurements of different durations at the same time.

* * * * *